June 18, 1963 W. L. HARRIES 3,094,633

SEMICONDUCTOR MULTIPLANAR RECTIFYING JUNCTION DIODE

Filed Sept. 29, 1960 3 Sheets-Sheet 1

INVENTOR.
WYNFORD L. HARRIES

BY Alfred C. Hill

AGENT

INVENTOR.
WYNFORD L. HARRIES
BY
Alfred C. Hill
AGENT

June 18, 1963 W. L. HARRIES 3,094,633

SEMICONDUCTOR MULTIPLANAR RECTIFYING JUNCTION DIODE

Filed Sept. 29, 1960 3 Sheets-Sheet 3

INVENTOR.
WYNFORD L. HARRIES
BY
Alfred C. Hill
AGENT

United States Patent Office
3,094,633
Patented June 18, 1963

3,094,633
SEMICONDUCTOR MULTIPLANAR RECTIFYING JUNCTION DIODE

Wynford L. Harries, Princeton, N.J., assignor to International Telephone and Telegraph Corporation, Nutley, N.J., a corporation of Maryland Filed Sept. 29, 1960, Ser. No. 59,266
10 Claims. (Cl. 307—88.5)

This invention relates to semiconductor diodes and more particularly to an improved semiconductor diode.

Semiconductors, whether elemental such as germanium or silicon, or compounds such as copper oxide, may be classified as to conductivity type, that is, N or P. In the N-type material conduction is carried on by electrons provided by donor impurities and in the P-type material conduction is carried on by holes provided by acceptor impurities. When a junction between a metallic connection and a semiconductor, or between two semiconductors of opposite conductivity types is created, it can show rectifying properties. If polarized in the direction of easy current flow, the semiconductor is said to be biased in the forward direction while when a junction is polarized to present a high impedance the semiconductor is said to be biased in the reverse direction.

Semiconductor diodes exhibit still another characteristic which occurs at the junction between the P- and N-type materials. This characteristic is known as the space charge or depletion layer region. Ths region is evidenced by an extremely small concentration of holes and electrons, so small as to be negligible in comparison to the number found in the body of the P- and N-type materials. The depth of the depletion layer depends on the magnitude and polarity of the voltage applied to the junction. The application of a reverse bias increases the depth of the depletion layer while application of a forward bias decreases the depth of the depletion layer. This characteristic of semi-conductor diodes has heretofore been employed as voltage variable capacitors. The configuration of the prior art semiconductor diode voltage variable capacitors have had the junction thereof disposed in a single plane only. A disadvantage of such an arrangement is that the capacity obtained and the variation of this capacity has been small even with substantial changes in the applied bias voltage.

Voltage variable capacitors particularly of the semiconductor diode type are coming into increasing use for application in automatic frequency control, panoramic scanning, stabilization of intermediate frequency as the automatic gain control varies, frequency, phase and amplitude modulation, automatic gain control, carrier frequency shifting, voltage control filters, spectrum analysis, radar applications, function generation and computers, blocking oscillators and multivibrators with controlled pulse width, high speed selection systems for computer magnetic memory drums, frequency conversion, and parametric amplication. To enhance the utilization of the semiconductor diode as a voltage variable capacitor in the above applications, it is preferable that a large change of capacity is obtained with change in voltage and that a higher ratio of $C_{max}$ to $C_{min}$ is obtainable where $C_{max}$ is the maximum value of capacity and $C_{min}$ equals the minimum value of capacity.

Therefore, an object of this invention is to provide an improved semiconductor diode having enhanced operating characteristics, particularly the voltage variable capacitor characteristic.

Another object of this invention is the provision of a semiconductor diode providing an improved voltage variable capacitor, a voltage variable resistor at high frequencies, and a phase shifting device at low frequencies when biased in the reverse direction and a negative resistance characteristic, a constant current characteristic, and an approximately constant voltage characteristic when based in the forward direction.

A feature of this invention is the provision of a semiconductor diode comprising a body of semiconductor material having a first zone of one conductivity type, a second zone of opposite conductivity type, and a multiplanar rectifying junction disposed therebetween and contiguous to the first and second zones.

A further feature of this invention is the provision of a multiplanar junction diode in accordance with this invention appropriately biased by a D.C. (direct current) voltage and/or an A.C. (alternating current) voltage to provide an improved voltage variable capacitor, a negative resistance device, a constant current device, a substantially constant voltage device, a phase shifting device and/or a voltage variable resistor.

The above-mentioned and other features and objects of this invention will become more apparent by reference to the following description taken in conjunction with the accompanying drawings, in which.

Figure 1:
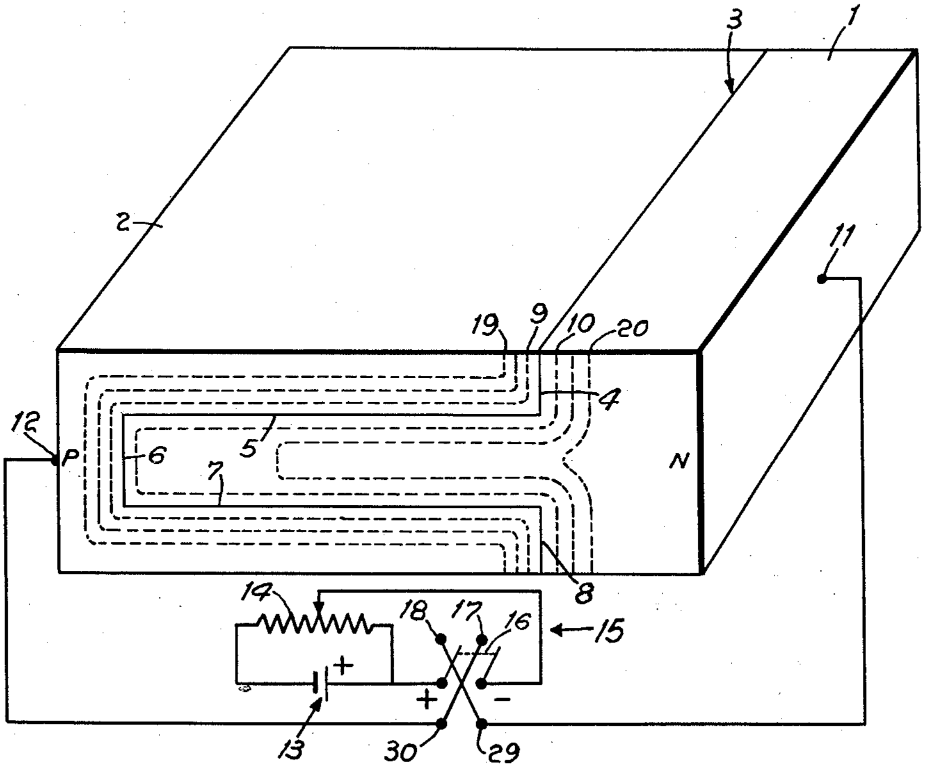
FIG. 1 is a schematic diagram, partially in perspective, of one embodiment of the semiconductor diode and biasing circuitry following the principles of this invention.

Referring to FIG. 1, there is illustrated therein a semiconductor diode following the principles of this invention comprising a body of semiconductor material including a first continuous zone 1 and a scond continuous zone 2, each of zones 1 and 2 being formed of opposite conductivity type material. Between zones 1 and 2 and contiguous thereto is a multiplanar rectifying junction 3 composed of portions 4, 5, 6, 7 and 8 being disposed in a plurality of different planes. The multiplanar rectifying junction 3 can be formed by normal semiconductor techniques with the process of solid state diffusion being preferred since the various portions of the junction can be made parallel to the outer surfaces of the semiconductor material.

Dotted lines 9 and 10 illustrate the outer edges of the depletion layer that is present about junction 3 without application of bias to the diode. The capacity of the depletion layer can be shown mathematically to be equal to the capacity between two metal plates coinciding with edges 9 and 10 with the material between them having the same dielectric constant as the semiconductor. Change in capacity of the depletion area is accomplished by increasing the spacing between the boundaries of the depletion layer by appropriately increasing a reverse bias voltage. Thus, to obtain a voltage variable condenser the semiconductor diode of this invention is appropriately biased by application of voltage to ohmic contacts 11 and 12 associated with zones 1 and 2, respectively. The appropriate bias is supplied by battery 13 and potentiometer 14 through the proper manipulation of switch 15. To reverse bias the semiconductor diode as illustrated where zone 1 is formed of N-type material and zone 2 is formed of P-type material, it is necessary that the positive potential be applied to contact 11 and a negative potenital be applied to contact 12. This is accomplished by positioning contact 16 of switch 15 in electrical contact with contacts 17 and 18.

With this potential impressed across the diode, it is possible through variation of potentiometer 14 to change the voltage across the diode and at the same time cause the boundaries of the depletion layer to move outwardly as indicated by dotted lines 19 and 20.

The capacity at the junction 3 is determined by the following formula:

$$C=\frac{KA}{4\pi d}$$

where $d$ is the distance between the boundaries of the depletion layer, A is the area of the boundary of the depletion layer and K is a constant. As the voltage is increased the depletion layer within the inner or N-type material of zone 1 shows an appreciable change in shape while the outer boundary located in the P-type material of zone 2 illustrates a more or less imperceptible change in shape for the various voltages. This is due in part to the different resistivity of zones 1 and 2. If the outer zone 2 is of low medium resistivity in the order of 10 ohm centimeters and region 1 is of a high resistivity in the order of 500 to 1,000 ohm centimeters, a depletion layer configuration similar to that illustrated in FIG. 1 will be obtained. Thus, by having a relatively high resistivity for zone 1 a given increase in reverse bias voltage will produce greater change in the position of the boundary of the depletion area in zone 1 as it moves away from the junction. With the addition of the multiplanar shape of junction 3, there is an additional change in configuruation which takes place causing the boundary of the depletion layer in zone 1 to be squeezed to the right of the illustration of FIG. 1. Thus, the boundary of the depletion layer in zone 1 has been substantially reduced and the area which defines the capacity is also reduced. Thus, the effect of an increased voltage is not only on an increase in depth of the depletion layer but also a decrease in the area of the boundary of the depletion layer. Thus, in accordance with the principles of this invention, application of a reverse bias voltage causes an increase in the distance between the boundaries of the depletion layer and due to the configuration of the diode, that is, the configuration providing multiplanar junction 3, there is an accompanying decrease in the area of one of the boundaries, namely, the boundary in the N-type material of zone 1. From the formula hereinabove set forth, it can be seen that effect of increasing the distance and decreasing the area are additive and thus the diode of FIG. 1 has a much greater change in capacity with voltage than the heretofore employed diodes having planar junctions.

To obtain a maximum change in capacity with changing voltage, it is important that the inner zone, zone 1, whether of P- or N-type material should contain a high resistivity. This is illustrated by referring to the formula:

$$d=0.04\sqrt{\rho V}$$

where $d$ equals the depth in mils of the depletion layer in silicon, $\rho$ is the resistivity of the material in ohm centimeters and V is the reverse bias voltage. Thus, the greater the resistivity of zone 1 the greater the amount of penetration and consequently the further the depletion layer boundary moves away from the junction. Thus, it is seen that a large variation in the depletion layer area and consequently capacity is possible with an inner material having a high value of resistivity.

Figure 2:
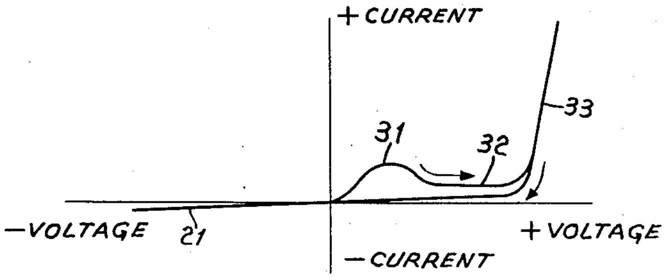
FIG. 2 is a graphical illustration of the current-voltage characteristics of the diode of FIG. 1.
Figure 3:
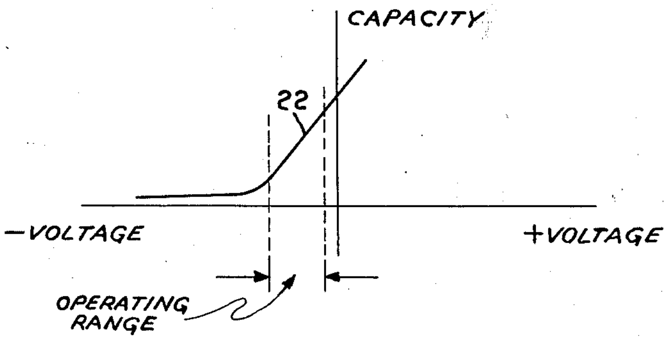
FIG. 3 is a graphical illustration of the capacity-voltage characteristic of the diode of FIG. 1.

Referring to FIG. 2, there is illustrated therein the voltage current characteristic of a diode having a configuration as set forth hereinabove with respect to FIG. 1, namely, a configuration to provide a multiplanar junction 3. To operate the diode of FIG. 1 as a voltage variable capacitor, the diode is reverse biased and as a consequence the diode is operated in that portion of curve of FIG. 2 represented by line 21 in the reverse quadrant. When operating in the reverse quadrant of the characteristic of curve of FIG. 2, in the manner described in connection hereinabove with FIG. 1, we find the operating range of this arrangement as depicted by the capacity-voltage curve of FIG. 3 wherein a relatively linear operating range is depicted by the portion 22 of the capacity-voltage curve.

The diode of FIG. 1 at or near the junction 3 can be represented as a number of capacitors in parallel each being in series with a resistance due to the high resistivity of the inner zone or zone 1. The resistance and capacity across the junction 3 is different at different points along junction 3. The resistance is the smallest at a point closest to the positive voltage contact, contact 11 in the illustration of FIG. 1. The resistance increases upon moving away from the positive contact along the periphery of the diode. Thus, an increase in reverse bias voltage not only changes the capacitance across the junction 3 but also the resistance. Since both the resistance and capacitance of the semiconductor diode vary with the change in reverse bias voltage, the semiconduuctor diode of this invention can be utilized in an electric circuit as a phase shifting network and as a voltage variable resistor under appropriate conditions.

Figure 4:
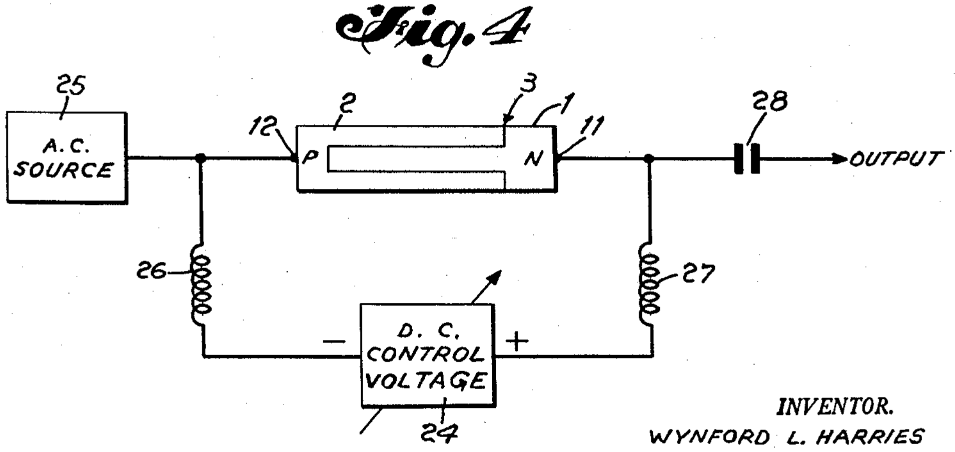
FIG. 4 is a schematic diagram incorporating the semiconductor diode of this invention to provide a phase shifting element and a voltage variable resistor.
Figure 5:
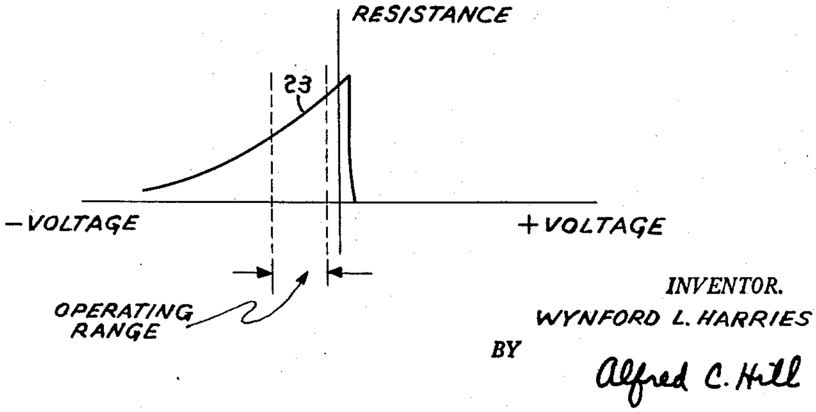
FIG. 5 is a graphical illustration of the resistance-voltage characteristic of the diode of FIG. 1.
Figure 6:
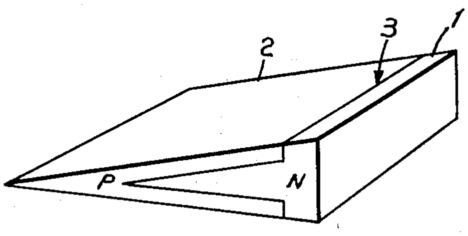
FIGS. 6 to 10 are diagrammatical illustrations in perspective of other configurations which the semiconductor diode of this invention may assume.

Referring to FIG. 4, there is illustrated therein a circuit arrangement utilizing the semiconductor diode in accordance with this invention as a phase shifting network and as a voltage variable resistor having the characteristics as illustrated in FIG. 5 by the resistance-voltage characteristic having a linear portion 23. The semiconductor diode of FIG. 1 is reverse biased by a D.C. control voltage from source 24 applied to ohmic contacts 11 and 12 of the diode. A source of alternating current signals 25 is applied to ohmic contact 12 of the diode. Choke coil 26 isolates source 24 from source 25 and choke coil 27 isolates source 24 from the output of the diode, contact 11. The output of the diode is coupled by means of a coupling condenser 28 to a utilization device. To operate the circuit of FIG. 4 as a phase shifter to vary the phase of the alternating signal of source 25, the magnitude of the control voltage of source 24 should be greater than the magnitude of the signal of source 25. As is well known, an alternating current signal can be phase shifted by passing the signals through a circuit element which has reactance as well as resistance. The amount of the phase angle shift depends upon the value of the resistance and the value and nature of the reactance. As was heretofore pointed out with respect to the semiconductor diode of this invention, the capacitance and resistance are varied with voltage changes from control source 24. Hence, since the capacitive reaction is inversely proportional to the capacity of the diode, variations in the voltage coupled from source 24 will induce a change in the resistance and capacitive reactance of the semiconductor diode, thereby causing the diode to present a different value of impedance for each value of reverse bias voltage coupled from source 24. The current of the impressed alternating current signal will be shifted in an angular phase relationship with respect to its voltage by the angle the vector impedance (the vectorial resolution of resistance and reactance) makes with the resistance vector.

Utilization is made of the fact that the capacitive reactance is inversely proportional to impressed frequency as well as the capacity to permit the utilization of semiconductor diode of this invention as a voltage variable resistance. When the impressed frequency of the signal from source 25 is sufficiently high to render the capacitive reactance negligible, the impedance of the semiconductor diode merely consists of resistance. Thus, the semiconductor diode of FIG. 1 connected as illustrated in FIG. 4, with a sufficiently high frequency signal impressed from source 25, will act as a variable voltage resistor having the characteristic illustrated by the curve of FIG. 5.

To utilize other operating characteristics of the diode of FIG. 1 as illustrated in FIG. 2, contact 16 of switch 15 is positioned to make contact with switch contacts 29 and 30 to bias the diode in the forward direction. Upon increasing the bias voltage applied from battery 13 by potentiometer 14 from a zero level to some positive voltage level, it is observed in accordance with the characteristic curve of FIG. 2 that there is a negative resistance portion as indicated at portion 31 of the curve of FIG. 2. Hence, operation of the diode in the region provides a negative resistance device. A possible explanation of the negative resistance region is that on biasing in the forward direction the low resistivity of zone 2 having P-type material injects holes into N-type material of zone 1. At the start the higher resistivity region 1 causes lateral voltage drop, so injection starts at a point along portion 5 of junction 3 closest to terminal 11. After injection, the minority carriers cause conductivity modulation and effectively turns a portion of the inner N-zone into a P-region. This results in a smaller area between the effective P- and N-zones. Thus, the area of injection decreases with time and this lowers the current in the diode giving a negative resistance region.

A further increase in the voltage causes a decrease in current and eventually a portion 32 is observed. Operation of the diode in this region provides a constant current device. A point is reached in the characteristics of the diode of FIG. 1 whereby an increase in voltage causes a relatively sharp increase in current and, hence, there is a portion 33 of the characteristics curve as illustrated in FIG. 2 which is substantially a constant voltage characteristic and, hence, the diode of FIG. 1 when forward biased in this region may be a constant voltage device.

Figure 8:
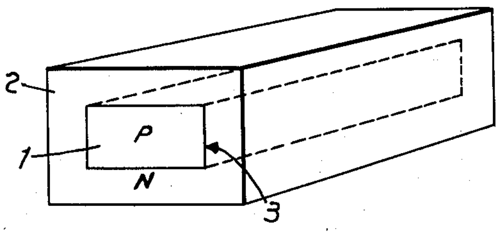

FIGS. 6 to 10 illustrate several other configurations which the diode of this invention may take and are illustrated here only as examples and do not limit in any way the configurations which the multiplanar semiconductor diode of this invention might assume to provide the multiplanar semiconductor diode which has the characteristics as described hereinabove. The configuration of FIG. 6 has an advantage over that of FIG. 1 in that the narrower the inner zone 1 is made the more abrupt the change in the depth of the depletion layer. Thus, by decreasing the depth of the inner zone of the planar junction semiconductor diode a greater variation in $$\frac{C_{max}}{C_{min}}$$

can be obtained for the same reverse bias voltage range. The configuration of FIG. 7 has an advantage over the configuration of the diode of FIG. 1 in that the pinched or narrowing of the portion 34 enhances the voltage variable capacitance range. The configuration of FIG. 8 illustrates that the inner zone 1 is completely surrounded by the outer zone 2. This semiconductor diode has a configuration which provides a greater junction area than the previously illustrated semiconductor diodes. With this configuration it is possible to obtain a greater variation in capacitance with change in reverse bias voltage than the previous configurations illustrated.

Figure 9:
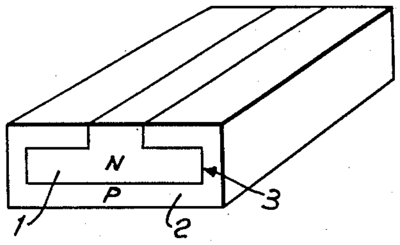
Figure 7:
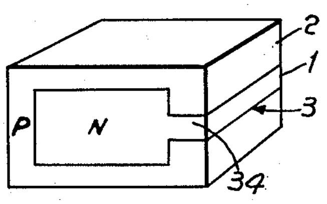
Figure 10:
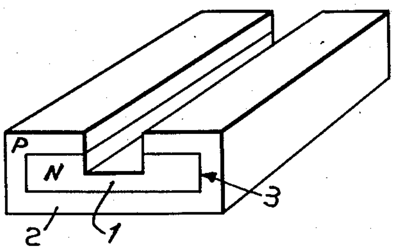

The configurations illustrated in FIGS. 9 and 10 are configurations which have important difference over the other multiplanar junction semiconductor diodes described herein. When connected as a semiconductor diode with a reverse bias voltage, the resistance of the semiconductor diode increases while the capacitance decreases as the reverse bias voltage is increased. This is different than the previously discussed diodes since the previously discussed diodes exhibited that characteristic where both the resistance and capacitance decreased as the reverse bias voltage was increased. Thus, when employed as a voltage variable resistance the diode configurations of FIGS. 9 and 10 produced a resistance which increases with increased reverse bias voltage while the diodes of FIGS. 1, 5, 6 and 7 exhibit a decrease in resistance with increased reverse bias.

Although all the examples illustrated in the drawings with the exception of the illustration of FIG. 8 have an inner zone, zone 1, of N-type material surrounding or sandwiched by an outer zone, zone 2, of P-type material, it is not essential for the operation of the semiconductor diode of this invention to have this arrangement. The most essential criteria, particularly for operation as a variable capacitor diode, is that the resistivity in the inner zone have a value which is greater than the resistivity of the outer zone. Hence, an inner zone of very high resistivity P-type material can be substituted for the N-type material illustrated and an outer zone may include a very low resistivity N-type material in place of the illustrated P-type material with the apropriate reversal of bias voltage polarity.

Thus, in accordance with the teachings of this invention a semiconductor diode formed from material of the proper resistivity having a PN junction in a plurality of planes provides a large variation of capacitance for a moderate change in reverse bias voltage. The extent of the variation required for a particular application can be obtained by the selection of a semiconductor diode having a particular configuration to provide the proper depth and resistivity of the inner zone. By biasing the semiconductor diode of this invention in a forward direction there may be obtained progressively a negative resistance device, a constant current device and a substantially constant voltage device.

While I have described above the principles of my invention in connection with specific apparatus, it is to be clearly understood that this description is made only by way of example and not as a limitation to the scope of my invention as set forth in the objects thereof and in the accompanying claims.

I claim:

1. A semiconductor diode comprising a first zone of semiconductive material of one conductivity type having a low resistivity in the order of 10 ohm centimeters, a second zone of semiconductive material of opposite conductivity type having a high resistivity in the order of 500 to 1000 ohm centimeters, said second zone being disposed within said first zone, a multiplanar rectifying junction disposed between and contiguous to said first and second zones, a first ohmic contact connected to said first zone, and a second ohmic contact connected to said second zone.

2. A semiconductor diode comprising a first zone of N-type material having a low resistivity in the order of 10 ohm centimeters, a second zone of P-type material having a high resistivity in the order of 500 to 1000 ohm centimeters, said second zone being disposed within said first zone, a multiplanar rectifying junction disposed between and contiguous to said first and second zones, a first ohmic contact connected to said first zone, and a second ohmic contact connected to said second zone.

3. A semiconductor diode comprising a first zone of P-type material having a low resistivity in the order of 10 ohm centimeters, a second zone of N-type material having a high resistivity in the order of 500 to 1000 ohm centimeters, said second zone being disposed within said first zone, a multiplanar rectifying junction disposed between and contiguous to said first and second zones, a first ohmic contact connected to said first zone, and a second ohmic contact connected to said second zone.

4. A voltage variable capacitor comprising a semiconductor diode including a first zone of semiconductive material of one conductivity type having a relatively low resistivity, a second zone of semiconductive material of opposite conductivity type having a relatively high resistivity, said second zone being disposed within said first zone, and a multiplanar rectifying junction disposed between and contiguous to said first and second zones, and means to controllably bias said junction in the reverse direction to vary the depth and area of the depletion layer associated with said junction.

5. A voltage variable capacitor comprising a semiconductor diode including a first zone of semiconductive material of one conductivity type having a relatively low resistivity, a second zone of semiconductive material of opposite conductivity type having a relatively high resistivity, said second zone being disposed within said first zone, and a multiplanar rectifying junction disposed between and contiguous to said first and second zones, an ohmic connection disposed in each of said zones, a source of variable bias voltage, and means coupling said bias voltage to said ohmic connections with appropriate polarity to bias said junction in the reverse direction to adjust the depth and area of the depletion layer associated with said junction.

6. A negative resistance device comprising a semiconductor diode including a first zone of semiconductive material of one conductivity type having a relatively low resistivity, a second zone of semiconductive material of opposite conductivity type having a relatively high resistivity, said second zone being disposed within said first zone, and a multiplanar rectifying junction disposed between and contiguous to said first and second zones, and means to controllably bias said junction in the forward direction to provide said diode with a negative resistance operating characteristic.

7. A constant current device comprising a semiconductor diode including a first zone of semiconductive material of one conductivity type having a relatively low resistivity, a second zone of semiconductive material of opposite conductivity type having a relatively high resistivity, said second zone being disposed within said first zone, and a multiplanar rectifying junction disposed between and contiguous to said first and second zones, and means to controllably bias said junction in the forward direction to provide said diode with a constant current operating characteristic.

8. A constant voltage device comprising a semiconductor diode including a first zone of semiconductive material of one conductivity type having a relatively low resistivity, a second zone of semiconductive material of opposite conductivity type having a relatively high resistivity, said second zone being disposed within said first zone, and a multiplanar rectifying junction disposed between and contiguous to said first and second zones, and means to controllably bias said junction in the forward direction to provide said diode with a substantially constant voltage operating characteristic.

9. A phase shift network comprising a semiconductor diode including a first zone of semiconductive material of one conductivity type having a relatively low resistivity, a second zone of semiconductive material of opposite conductivity type having a relatively high resistivity, said second zone being disposed within said first zone, and a multiplanar rectifying junction disposed between and contiguous to said first and second zones, a source of alternating current signal to be phase adjusted, the frequency of said alternating current signal rendering the impedance of said diode reactive, means to remove from said diode said phase adjusted alternating current signal, and means to controllably bias said junction in the reverse direction to adjust the phase of said alternating current signal.

10. A voltage variable resistance comprising a semiconductor diode including a first zone of semiconductive material of one conductivity type having a relatively low resistivity, a second zone of semiconductive material of opposite conductivity type having a relatively high resistivity, said second zone being disposed within said first zone, and a multiplanar rectifying junction disposed between and contiguous to said first and second zones, a source of alternating current signal having a frequency rendering the impedance of said diode resistive, and means to controllably bias said junction in the reverse direction to adjust the value of said resistive impedance.

References Cited in the file of this patent

UNITED STATES PATENTS

| | | |
|---|---|---|
| 2,306,555 | Mueller | Dec. 29, 1942 |
| 2,756,285 | Shockley | July 24, 1956 |
| 2,841,508 | Roup et al. | July 1, 1958 |
| 2,843,511 | Pankove | July 15, 1958 |
| 2,884,607 | Uhlir | Apr. 28, 1959 |
| 2,989,671 | Barnes et al. | June 20, 1961 |
| 2,991,371 | Lehovec | July 4, 1961 |

OTHER REFERENCES

"A Semiconductor Current Limiter," by Warner et al., Proc. of the IRE, January 1959, pages 44–56.

Handbook of Semiconductor Electronics by Hunter, McGraw-Hill, 1956, pages 4–29.